(12) United States Patent
Pearson

(10) Patent No.: US 11,469,742 B2
(45) Date of Patent: Oct. 11, 2022

(54) WAVEFORM GENERATOR

(71) Applicants: Owlstone Medical Limited, Cambridge (GB); Owlstone Inc., Westport, CT (US)

(72) Inventor: Jonathan Pearson, Cambridge (GB)

(73) Assignees: Owlstone Medical Limited, Cambridge (GB); Owlstone Inc., Westport, CT (US)

( * ) Notice: Subject to any disclaimer, the term of this patent is extended or adjusted under 35 U.S.C. 154(b) by 0 days.

(21) Appl. No.: 17/285,572

(22) PCT Filed: Oct. 18, 2019

(86) PCT No.: PCT/GB2019/052977
§ 371 (c)(1),
(2) Date: Apr. 15, 2021

(87) PCT Pub. No.: WO2020/079446
PCT Pub. Date: Apr. 23, 2020

(65) Prior Publication Data
US 2021/0409006 A1 Dec. 30, 2021

(30) Foreign Application Priority Data
Oct. 18, 2018 (GB) ..................... 1816996

(51) Int. Cl.
*H03K 3/017* (2006.01)
*H03B 19/14* (2006.01)
*G01N 27/624* (2021.01)

(52) U.S. Cl.
CPC ............. *H03K 3/017* (2013.01); *H03B 19/14* (2013.01); *G01N 27/624* (2013.01); *H03B 2200/003* (2013.01); *H03B 2201/0266* (2013.01)

(58) Field of Classification Search
CPC ... H02M 7/48; H03B 19/14; H03B 2200/003; H03B 2201/0266; H03K 3/017
See application file for complete search history.

(56) References Cited

U.S. PATENT DOCUMENTS 5,923,542 A * 7/1999 Sasaki ................ H01L 41/044
363/16
2009/0189064 A1 7/2009 Miller et al.
(Continued)

FOREIGN PATENT DOCUMENTS

CA 2024588 C 3/1996
WO 2007014303 A2 2/2007

*Primary Examiner* — Levi Gannon
(74) *Attorney, Agent, or Firm* — Leveque Intellectual Property Law, PC

(57) ABSTRACT

The waveform generator (10) comprises a switch (13). The waveform generator (10) comprises a transformer (15) having a primary side circuit and a secondary side circuit. The primary side circuit has a first terminal arranged to be conductively coupled to a DC voltage source, and a second terminal conductively coupled to the switch (13). The waveform generator (10) further comprises a controller (11) arranged to supply a drive signal to the switch for switching the switch between on and off states. The controller (11) is arranged to adjust the frequency of the drive signal so as to control at least one of the peak voltage and the duty cycle of a waveform generated by the waveform generator (10). The frequency of the drive signal may be adjusted as the voltage level of the DC voltage source remains constant. The frequency of the drive signal may be adjusted in response to a change in the voltage level of the DC voltage source.

15 Claims, 8 Drawing Sheets

(56) References Cited

U.S. PATENT DOCUMENTS

| | | | |
|---|---|---|---|
| 2009/0256423 A1* | 10/2009 | Kyono | H02M 3/33561 |
| | | | 307/31 |
| 2012/0230062 A1 | 9/2012 | Nagai et al. | |
| 2014/0091718 A1 | 4/2014 | Brinlee | |
| 2016/0380621 A1* | 12/2016 | Hiley | H01F 19/04 |
| | | | 327/111 |
| 2020/0153342 A1* | 5/2020 | Takahashi | H02M 1/15 |

\* cited by examiner

WAVEFORM GENERATOR

The present invention is directed towards a waveform generator. The waveform generator comprises a switch. The waveform generator comprises a transformer having a primary side circuit and a secondary side circuit. The primary side circuit has a first terminal arranged to be conductively coupled to a DC voltage source, and a second terminal conductively coupled to the switch.

In existing systems, the switches of such waveform generators may be driven at a fixed frequency, say 25 megahertz (MHz). The input voltage to the primary side circuit may be controlled to so as to control the generation of the output waveform.

In operation, the waveform generator may be required to generate a waveform with a particular dispersion field. This is required, in particular, for waveform generators for use in generating waveforms for ion filter devices, such as Field Asymmetric Ion Mobility Spectrometer (FAIMS). The dispersion field is sensitive to the atmospheric pressure and the temperature in the vicinity of the waveform generator. Consequently, depending on the pressure and/or temperature conditions, the input voltage may need to be varied to generate the desired dispersion field. Different input voltages may change the waveform shape, which is undesirable. Here, a change in the waveform shape may mean a change in the duty cycle and/or the peak voltage of the waveform. The different waveform shapes are generally caused by capacitance effects caused by voltage dependent effects of the switch. Generally, at high input/output waveform voltages, the switch (e.g. a Metal Oxide Semiconductor Field Effect Transistor, MOSFET) has a low capacitance which gives a low duty cycle. At low input/output waveform voltages the switch has a high capacitance which gives a high duty cycle.

The capacitance effects may, in part, be compensated for by adding shunt capacitors at particular locations within the waveform generator circuit.

It is an object of the present invention to provide an improved, or at least an alternative, way to control at least one of the duty cycle and the peak voltage of the generated waveform.

According to the present invention there is provided an apparatus and method as set forth in the appended claims. Other features of the invention will be apparent from the dependent claims, and the description which follows.

According to a first aspect of the invention, there is provided a waveform generator. The waveform generator comprises a switch. The waveform generator comprises a transformer having a primary side circuit and a secondary side circuit. The primary side circuit has a first terminal arranged to be conductively coupled to a DC voltage source, and a second terminal conductively coupled to the switch. The waveform generator further comprises a controller arranged to supply a drive signal to the switch for switching the switch between on and off states. The controller is arranged to adjust the frequency of the drive signal so as to control at least one of the peak voltage and the duty cycle of a waveform generated by the waveform generator.

In one example, the controller is arranged to adjust the frequency of the drive signal while the voltage level of the DC voltage source is substantially constant or constant.

Changing the frequency of the drive signal at a constant input voltage can result in a change in the waveform shape. When the waveform generator is used with an ion filter device, this change in waveform shape could be used, for example, as an additional axis in the identification of chemicals. For example, a spectra of dispersion field (DF) vs compensation field (CF) could be obtained at a first waveform shape setting (e.g. a first frequency of the drive signal at the maximum input voltage level). Another spectra of the DF vs CF could be obtained at a second waveform shape setting (e.g. a second frequency of the drive signal at the maximum input voltage level). This helps improve the selectivity between chemicals.

In one example, the controller is arranged to adjust the frequency of the drive signal in response to a change in the voltage level of the DC voltage source.

Significantly, the present invention provides a controller. The controller is arranged to adjust (e.g. automatically and without user input) the frequency of the drive signal in response to a change in the voltage level of the DC voltage source. Changing the frequency drive signal enables at least one of the peak voltage and the duty cycle of the waveform generated by the waveform generator to be controlled. In particular, changing the frequency of the drive signal has the effect of changing both the peak voltage of the waveform and the duty cycle of the waveform. The frequency of the drive signal can thus be adjusted to arrive at one or both of a particular desired peak voltage of the waveform and a particular desired duty cycle of the waveform.

The present invention is able to compensate for/correct for changes in the waveform shape caused by a change in the voltage level of the DC voltage source. The voltage level of the DC voltage source may be changed, for example, to provide a particular dispersion field value as the pressure and/or temperature in the vicinity of the waveform generator changes.

The controller may be arranged to adjust the frequency of the drive signal as the voltage level of the DC voltage source changes so as to control the peak voltage of the waveform generated by the waveform generator.

Waveform generator circuits have tolerances, which mean that different waveform generator units (with the same circuit design) will problematically generate different output voltages to be supplied to the load. Particular loads, especially ion filter devices such as Field Asymmetric Ion Mobility Spectrometer, FAIMS, are sensitive to the output voltage. The output voltage is generally required to be measured accurately and be very similar if not the same across different FAIMS systems. In existing approaches, waveform generators have been manually tuned by measuring the output voltage and by changing or adjusting a component of the waveform generator to alter the output voltage. This is a manual and time consuming procedure. In addition, depending on the tolerance of the tuning component, this approach is not ideal. Significantly, however, the present invention provides a controller that changes the drive signal supplied to the switch which enables the peak voltage (the peak output voltage of the waveform) to be adjusted, and tuned to a particular value. In this way, a plurality of waveform generators could all generate the same output voltage waveform for a particular input voltage (by all using particular, selected, frequencies of the drive signal) despite differences due to manufacturing tolerances. This tuning process may be entirely automated.

The controller may be arranged to adjust the frequency of the drive signal as the voltage level of the DC voltage source changes so as to substantially maintain the duty cycle of the waveform generated by the waveform generator at a constant value. Advantageously, the present invention is thus able to adjust the frequency of the waveform to compensate for changes in the duty cycle caused by changes in the capacitance of the switch, e.g. as a dispersion field of the waveform changes.

In certain applications it is desirable to maintain a constant duty cycle for the waveform generated by the waveform generator. Particular applications where this is desired include ion filter devices, such as FAIMS. Generally, however, the duty cycle of the waveform is dependent on the input/output waveform voltage. This relationship is non-linear, and is primarily due to voltage dependent behaviour of the switch (the switch may be a FET, for example). The present invention is able to control the duty cycle by adjusting the frequency of the drive signal for the switch. This may be a simpler, more manageable, and effective solution than adding shunt capacitances into the waveform generator circuit. Therefore, the present invention allows the duty cycle to remain constant while also making the relationship between the input and output voltage of the waveform more linear.

The controller may be arranged to adjust the frequency of the drive signal by increasing the frequency of the drive signal as the voltage level of the DC voltage source increases, and by decreasing the frequency of the drive signal as the voltage level of the DC voltage source decreases. Therefore, the present invention may lower the frequency of the drive signal at low input/output waveform voltages to linearize the duty cycle and consequently the input vs output voltage relationship.

The controller may be arranged to receive the voltage level of the DC voltage source. The controller may be arranged to determine a frequency of the drive signal to be supplied to the switch based on the voltage level of the DC voltage source so as to substantially maintain the duty cycle of the waveform generated by the waveform generator at a constant value.

The received voltage level of the DC voltage source may be determined based on a desired field strength of an oscillating electric field generated by the waveform.

The received voltage level of the DC voltage source may be determined based on the desired field strength and an indication of the atmospheric pressure level in the vicinity of the waveform generator.

The received voltage level of the DC voltage source may be determined based on the desired field strength and an indication of the temperature in the vicinity of the waveform generator.

The received voltage level of the DC voltage source may be determined by determining a desired voltage of the waveform so as to achieve the desired field strength, and by determining a voltage level of the DC voltage source that results in the waveform having the desired voltage.

The desired voltage of the waveform may be determined by multiplying the desired field strength by a multiplication factor.

The multiplication factor may include an indication of the atmospheric pressure level in the vicinity of the waveform generator.

The multiplication factor may include an indication of the temperature in the vicinity of the waveform generator.

The multiplication factor may include both the indication of the atmospheric pressure level in the vicinity of the waveform generator and the indication of the temperature in the vicinity of the waveform generator.

The controller may be arranged to determine access a data store so as to determine the frequency of the drive signal.

The data store may comprise parameters for a function that defines the relationship between the voltage level of the DC voltage source and the drive frequency to be supplied to the switch to achieve a particular duty cycle. The voltage level may be the dependent variable for the function, and the drive frequency may be the independent variable for the function. The function may be a polynomial function. The controller may be operable to use a voltage level of the DC voltage source and the obtained parameters for the function so as to determine the drive frequency required to be supplied to the switch so as to achieve the particular duty cycle. The controller may be operable to use the received voltage level of the DC voltage source and the obtained parameters for the function so as to determine the drive frequency required to be supplied to the switch so as to achieve the particular duty cycle. The parameters may be determined during a calibration of the waveform generator. The parameters may be programmed into firmware of the waveform generator. The parameters may also be in software of the waveform generator.

The data store may comprise a plurality of predetermined frequency values for the drive signal. The controller may be arranged to adjust the frequency of the drive signal according to one of the plurality of predetermined frequency values.

The data store may comprise the plurality of predetermined frequency values and a plurality of voltage levels. Each of the voltage levels may correspond to one of the predetermined frequency values. The controller may be arranged to receive the voltage level of the DC voltage source and select a predetermined frequency value that corresponds to the voltage level of the DC voltage source. The controller may be arranged to adjust the frequency of the drive signal as the voltage level of the DC voltage source changes so as to substantially maintain the duty cycle of the waveform generated by the waveform generator at a constant value. Each of the plurality of predetermined frequency values may be selected so that, when the DC voltage source is at the associated voltage level, the drive signal with the predetermined frequency value is supplied to the switch, and as such the duty cycle of the waveform generated by the waveform generator is substantially equal to the constant value.

The controller may be arranged to adjust the frequency of the drive signal as the DC voltage source is at a first voltage level so as to generate a waveform having a predetermined peak voltage. This may be performed during a calibration stage.

The controller may be arranged to store the frequency of the drive signal that results in the waveform having the predetermined peak voltage when the DC voltage source is at the first voltage level. The controller may be arranged to store the frequency of the drive signal in a data store.

The controller may be arranged to determine the duty cycle of the waveform having the predetermined peak voltage. The controller may be arranged to adjust the frequency of the drive signal as the DC voltage source is at a second voltage level so as to generate a waveform having the determined duty cycle.

The controller may be arranged to store the frequency of the drive signal that results in the waveform having the determined duty cycle when the DC voltage source is at the second voltage level. The controller may be arranged to store the frequency of the drive signal in a data store.

For each of a plurality of other voltage levels of the DC voltage source, the controller may be arranged to adjust the frequency of the drive signal so as to adjust the generated waveform to have the same duty cycle as the duty cycle of the waveform generated with the predetermined peak voltage at the first voltage level. As a result of this process, a plurality of ordered pairs is obtained. Each ordered pair includes a voltage level of the DC voltage source, and a frequency of the drive signal required for the waveform to have the desired duty cycle.

The ordered pairs may be stored, e.g. in the data store. The ordered pairs may be stored in the form of a look up table. The data store may thus comprise a plurality of predetermined frequency values for the drive signal. The data store may thus comprise the plurality of predetermined frequency values and a plurality of voltage levels. Each of the voltage levels may correspond to one of the predetermined frequency values.

The controller may be arranged to receive the voltage level of the DC voltage source and select a predetermined frequency value that corresponds to the voltage level of the DC voltage source.

The data store may thus comprise a lookup table defining a plurality of voltage levels, and a plurality of corresponding frequency values for generating a waveform having the desired duty cycle.

The ordered pairs may be fitted to a function that defines the relationship between the voltage level of the DC voltage source and the drive frequency to be supplied to the switch to achieve a particular duty cycle. The voltage level may be the dependent variable for the function, and the drive frequency may be the independent variable for the function. The function may be a polynomial function. The parameters (coefficients) of the function determined as a result of the fitting process may be stored, e.g. in the data store. Storing the parameters in the data store may mean that the parameters are programmed into firmware of the waveform generator/controller.

The switch may a voltage dependent switch. Because the switch is voltage dependent, the capacitance of the waveform generator circuit the switch is a part of changes due to a change in the DC voltage level. The voltage dependent switch may be a Field Effect Transistor, FET. The transformer may be conductively coupled to the drain of the FET, and wherein the gate of the FET is arranged to receive the drive signal. The FET may be a MOSFET. The voltage dependent switch may be a silicon/hybrid device.

The waveform may be arranged to be applied across an ion filter device, and preferably a Field Asymmetric Ion Mobility Spectrometer, FAIMS.

The waveform generator may be configured to generate two waveforms of opposite polarity so as to provide a voltage gain across a load.

The primary side circuit may comprise a first inductor. The secondary side circuit may comprise a second inductor inductively coupled to the first inductor. A first output region may be conductively coupled to the load and a second output region may be conductively coupled to the load. The first inductor may be arranged to be conductively coupled to the first output region so as to supply a first of the two waveforms to the load. The second inductor may be arranged to be conductively coupled to the second output region so as to supply a second of the two waveforms to the load.

The two waveforms may have a frequency of between 1 MHz and 100 MHz, and optionally between 10 MHz and 50 MHz, and optionally wherein the two waveforms have a peak voltage with a magnitude of between 0.5 V and 1500 V, and optionally wherein the two waveforms have a duty cycle of less than 50%. The present invention is not limited to any particular frequency of waveform, peak voltage of waveform, or duty cycle of waveform. The peak voltage of the waveforms may have a magnitude of between 100 V and 1500 V, 500 V and 1500 V or 1000 V and 1500 V. The peak voltage of the waveforms may have a magnitude of between 0.5 V and 1000 V, 0.5 V and 500 V or 0.5 V and 100 V.

According to a second aspect of the invention, there is provided a system comprising: a load, wherein the load is optionally an ion filter device, and preferably a Field Asymmetric Ion Mobility Spectrometer, FAIMS; and a waveform generator as described above in relation to the first aspect of the invention for supplying a waveform to the load.

According to a third aspect of the invention, there is provided a method of controlling a waveform generator as described above in relation to the first aspect of the invention. The method comprises: at a first voltage level of the DC voltage source, adjusting the frequency of the drive signal supplied to the switch until a waveform generated by the waveform generator has a predetermined peak voltage. The method further comprises determining the duty cycle of the waveform generated with the predetermined peak voltage. The method further comprises: for each of one or more other voltage levels of the DC voltage source, adjusting the frequency of the drive signal supplied to the switch until a waveform generated by the waveform generator has the determined duty cycle.

Optionally, the method further comprises storing each of the voltage levels and the corresponding frequency of the drive signal required so that the waveform generated by the waveform generator has the determine duty cycle.

Optionally, each of the voltage levels and the corresponding frequency of the drive signal form an ordered pair.

Optionally, the method further comprises: fitting the ordered pairs to a function that defines the relationship between the voltage level of the DC voltage source and the drive frequency to be supplied to the switch to achieve a particular duty cycle; and storing the parameters of the fitted function.

The third aspect of the invention relates generally to a calibration method for determined frequency values for different voltage levels of the DC voltage source that result in the waveform being generated with a desired or required duty cycle. The determined frequency values and voltage levels may be stored in a look-up table for subsequent retrieval. This is described in greater detail in relation to the first aspect of the invention. The determined frequency values may be used in a curve/function fitting procedure so as to determine parameters for the curve/function. This is also described in greater detail in relation to the first aspect of the invention. The method may be performed automatically, i.e. without user input.

The first voltage level may be a maximum voltage level. In one example, the voltage level is decreased in increments from the maximum voltage level to a minimum voltage level. The required drive frequency to achieve the desired duty cycle may be determined at each of these voltage level increments.

According to a fourth aspect of the invention, there is provided a method of controlling a waveform generator as claimed in any preceding claim, the method comprising: applying a DC voltage to the transformer; and supplying a drive signal to the switch for switching the switch between on and off states, wherein the frequency of the drive signal is so as to control at least one of the peak voltage and the duty cycle of a waveform generated by the waveform generator.

In one example, the frequency of the drive signal is adjusted while the voltage level of the DC voltage source is substantially constant.

In one example, the frequency of the drive signal is adjusted in response to a change in the voltage level of the DC voltage source, Applying the DC voltage may comprise adjusting the voltage level in increments from a starting voltage to a target voltage. For each voltage increment, the method may comprise adjusting the frequency of the drive signal so as to substantially maintain the duty cycle of the waveform generated by the waveform generator at a constant value. Adjusting the voltage in increments may comprise adjusting the voltage in increments during a number of cycles until the target voltage is reached. In each cycle, the voltage may be adjusted in increments from an initial voltage to a final voltage, wherein the initial voltage and the final voltage are adjusted after each cycle.

FIG. 13 is a schematic diagram of an example load that the waveform generator of examples of the present invention may be arranged to supply waveforms to;

Figure 1:
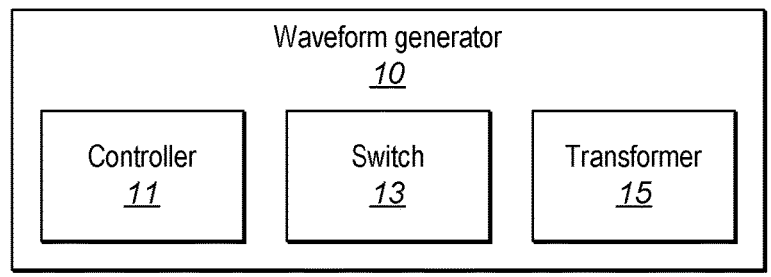
FIG. 1 is a schematic diagram of an example waveform generator according to the present invention.

Referring to FIG. 1, there is shown a simplified schematic diagram of a waveform generator 10 in accordance with aspects of the present invention. The waveform generator 10 comprises a controller 11, a switch 13, and a transformer 15. The transformer 15 has a primary side circuit and a secondary side circuit. The primary side circuit has a first terminal arranged to be conductively coupled to a DC voltage source, and a second terminal conductively coupled to the switch 13. The controller 11 is arranged to supply a drive signal to the switch for switching the switch between on and off states.

The controller 11 is arranged to adjust the frequency of the drive signal so as to control at least one of the peak voltage and the duty cycle of a waveform generated by the waveform generator.

In one example, the controller 11 is arranged to adjust the frequency of the drive signal while the voltage level of the DC voltage source remains substantially constant.

In one example, the controller 11 is arranged to adjust the frequency of the drive signal in response to a change in the voltage level of the DC voltage source.

Figure 2:
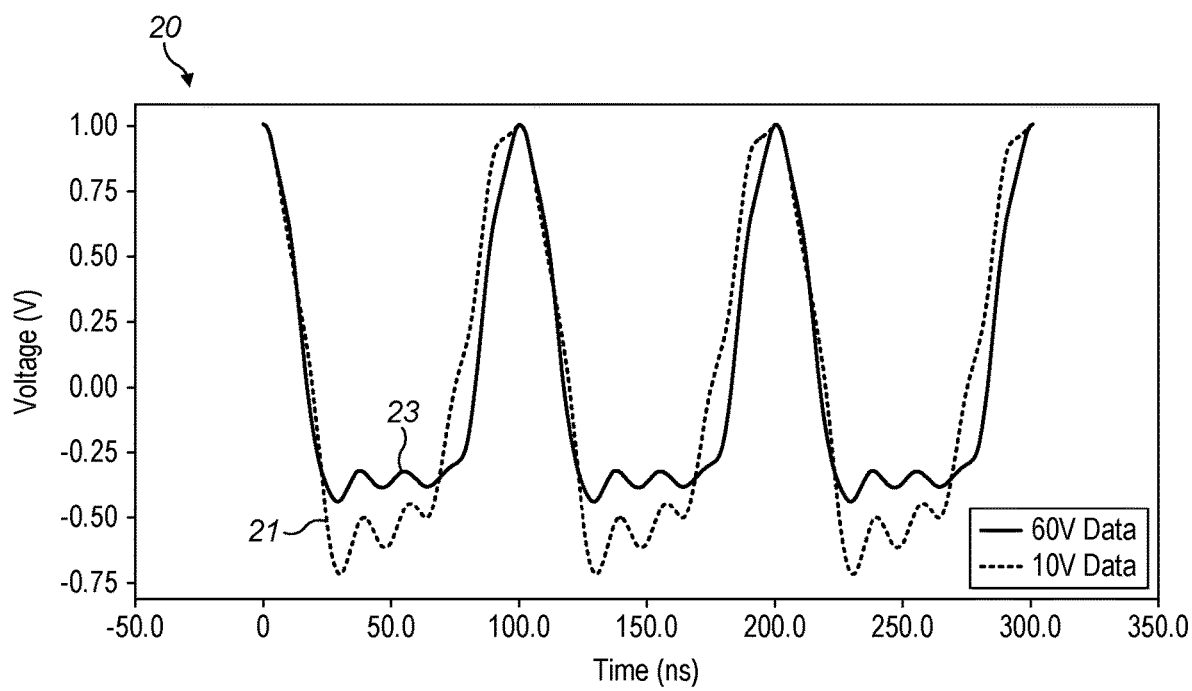
FIG. 2 is a plot of two waveforms generated at two different input voltages according to a existing waveform generator.

Referring to FIG. 2, there is shown an example plot 20 of two generated waveforms 21, 23 at two different input voltages. A first of the waveforms, 21, is generated using a voltage level of 10 volts for the DC voltage source. A second of the waveforms, 23, is generated using a voltage level of 60 volts for the DC voltage source. The frequency of the drive signal is not adjusted at the different voltage levels of the DC voltage source. Instead, a fixed frequency of 25 MHz is used at each of the voltage levels. FIG. 2 thus relates to an existing implementation. In this plot, the voltages values are scaled for ease of comparison.

In FIG. 2, it can be seen that the waveform 21 generated when the voltage level of the DC voltage source is 10 volts has a different shape to the waveform 23 generated when the voltage level of the DC voltage source is 60 volts. In particular, it can be seen that the 'on' period of the waveform 21 is greater than the 'on' period for the waveform 23, and thus the duty cycle of the two waveforms is different. Further, the relative peak height for the waveforms 21 and 23 are different. These differences are due to the voltage dependent capacitance effect of the switch 13 (FIG. 1).

Figure 3:
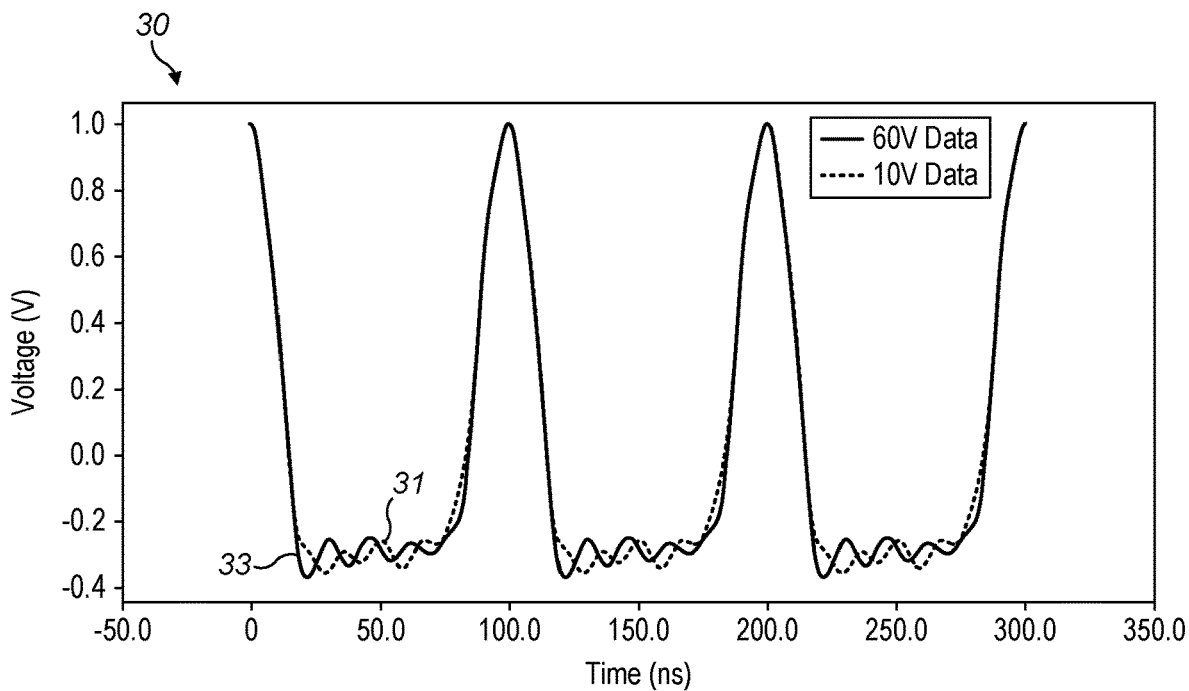
FIG. 3 is a plot of two waveforms generated at two different input voltages according to an example waveform generator of the present invention.

Referring to FIG. 3, there is shown an example plot 30 of two generated waveforms 31, 33 at two different input voltages. A first of the waveforms, 31, is generated using a voltage level of 10 volts for the DC voltage source. A second of the waveforms, 33, is generated using a voltage level of 60 volts for the DC voltage source. In contrast to FIG. 2, the drive signal of the switch 13 (FIG. 1) is adjusted at the different voltage levels of the DC voltage source. In particular, the drive frequency of the switch 13 when the voltage level of the DC voltage source is 10 volts is lower than the drive frequency of the switch 13 when the voltage level of the DC voltage source is 60 volts. FIG. 3 thus relates to an implementation according to the present invention. In this plot, the voltages values are scaled for ease of comparison.

In FIG. 3, it can be seen that the waveform 31 generated when the voltage level of the DC voltage source is 10 volts has substantially the same shape as the waveform 33 generated when the voltage level of the DC voltage source is 60 volts. In particular, it can be seen that the 'on' period of the waveform 31 is substantially the same as the 'on' period for the waveform 33, and thus the duty cycle of the two waveforms are substantially the same. Further, the relative peak height for the waveforms 31 and 33 are substantially the same. Importantly, adjusting the drive signal as the voltage level of the DC voltage source changes mitigates for/avoids the voltage dependent capacitance effect of the switch 13 (FIG. 1).

Figure 4:
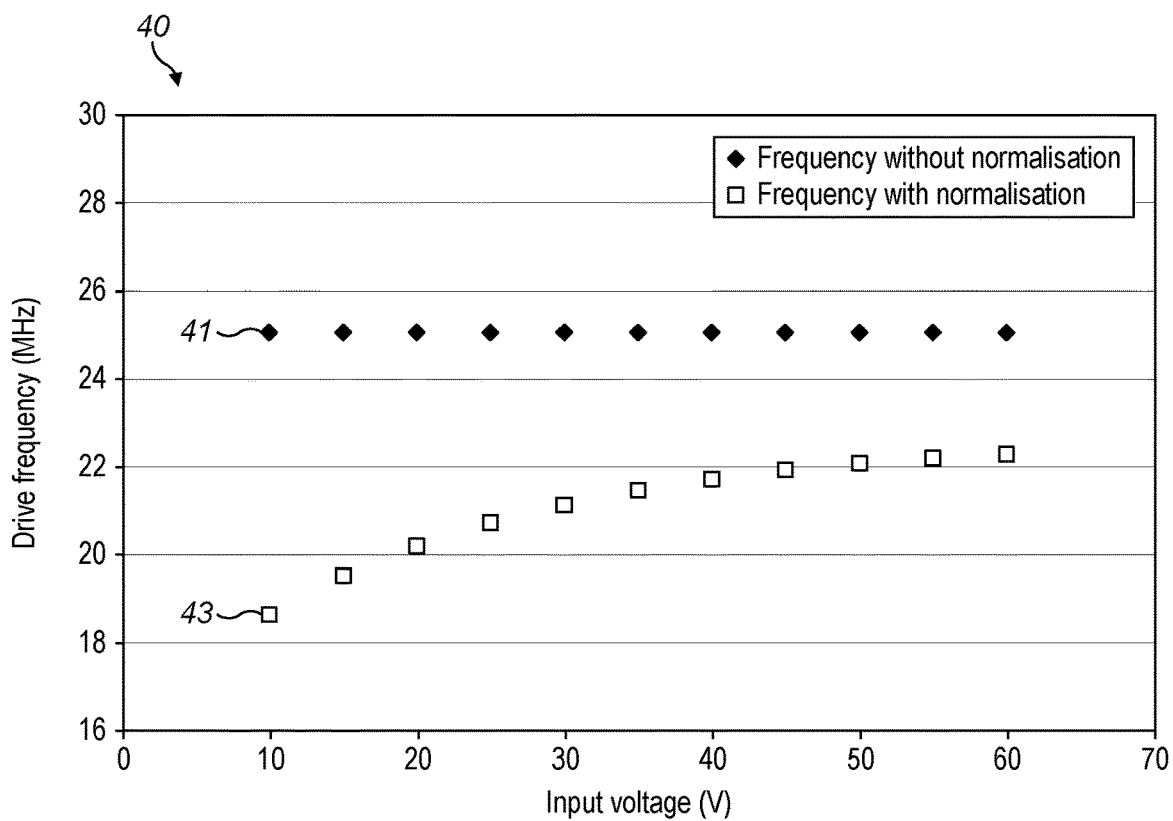
FIG. 4 is a plot of the frequency of the drive signal supplied to a switch of the waveform generator at different input voltages according to a existing waveform generator and an example waveform generator of the present invention.

Referring to FIG. 4, there is shown an example plot 40 of the frequency of the drive signal applied to the switch 13 compared to the input voltage. The diamond-shaped data points 41 in FIG. 4 show how the frequency of the drive signal applied to the switch 13 (FIG. 1) remains constant across different voltage levels of the DC voltage source in accordance with existing implementations. The square-shaped data points 43 in FIG. 4 show how the frequency of the drive signal applied to the switch 13 is different for different voltage levels of the DC voltage source. In particular, FIG. 4 shows an example implementation where the drive frequency is increased as the input voltage increases.

Figure 5:
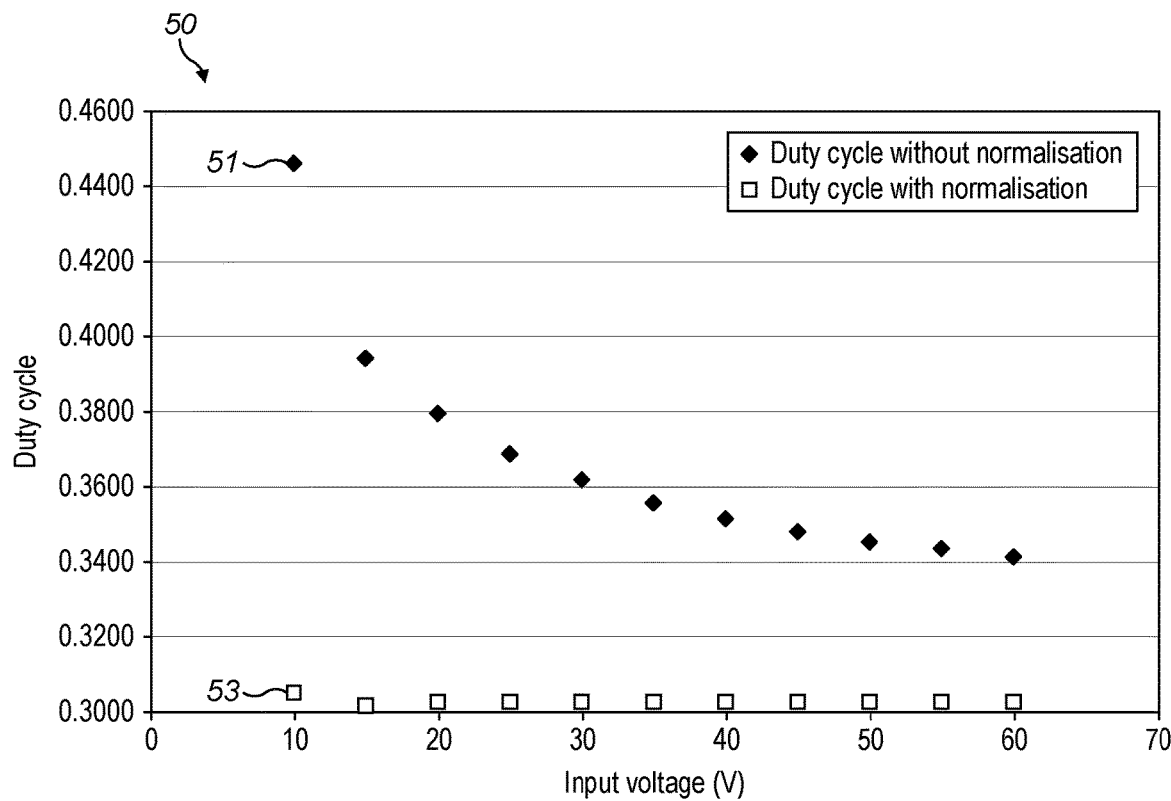
FIG. 5 is a plot of the duty cycle of waveforms generated at different input voltages according to a existing waveform generator and an example waveform generator of the present invention.

Referring to FIG. 5, there is shown an example plot 50 of the duty cycle of the generated waveform compared to the voltage level of the DC voltage source. The diamond-shaped data points 51 in FIG. 5 show the duty cycle of waveforms generated without adjustment of the frequency of the drive signal applied to the switch 13. The diamond-shaped data points 51 show how the duty cycle undesirably changes as the voltage level of the DC voltage source changes when a frequency adjustment procedure is not used. The square-shaped data points 53 in FIG. 5 show the duty cycle of waveforms generated with adjustment of the frequency of the drive signal applied to the switch 13 in accordance with the present invention. The square-shaped data points 53 show how the duty cycle remains substantially constant across the different input voltages when the frequency adjustment procedure is used.

In some implementations of the present invention, the waveform generated by the waveform generator may be required to generate a particular reduced electric field. Here, a reduced electric field refers to the ratio E/N, where E is the electric field and N is the concentration of neutral particles. A physical unit of the reduced electric field E/N is known as the Townsend, Td. 1 Townsend is defined as being equal to $10^{-21}$ V m$^2$. That is, 10 to the power of minus 21 Volts times metres squared.

Importantly, N, the concentration of neutral particles is defined as N=P/(Kb*T), where P is the pressure, Kb is the Boltzmann constant, and T is the temperature. This means that if the pressure or the temperature in the vicinity of the waveform generator changes, the electric field required to generate the reduced electric field with the desired Townsend value is changed. The electric field is changed by changing the voltage level of the DC voltage source. In other words, a different input voltage is used.

For example, if the waveform generator is moved to a location where the pressure is lower, the value for N will be lower. Because of this a smaller electric field will be required to be at the same Townsend value, and as such a lower voltage level of the DC voltage source may be used.

Figure 6:
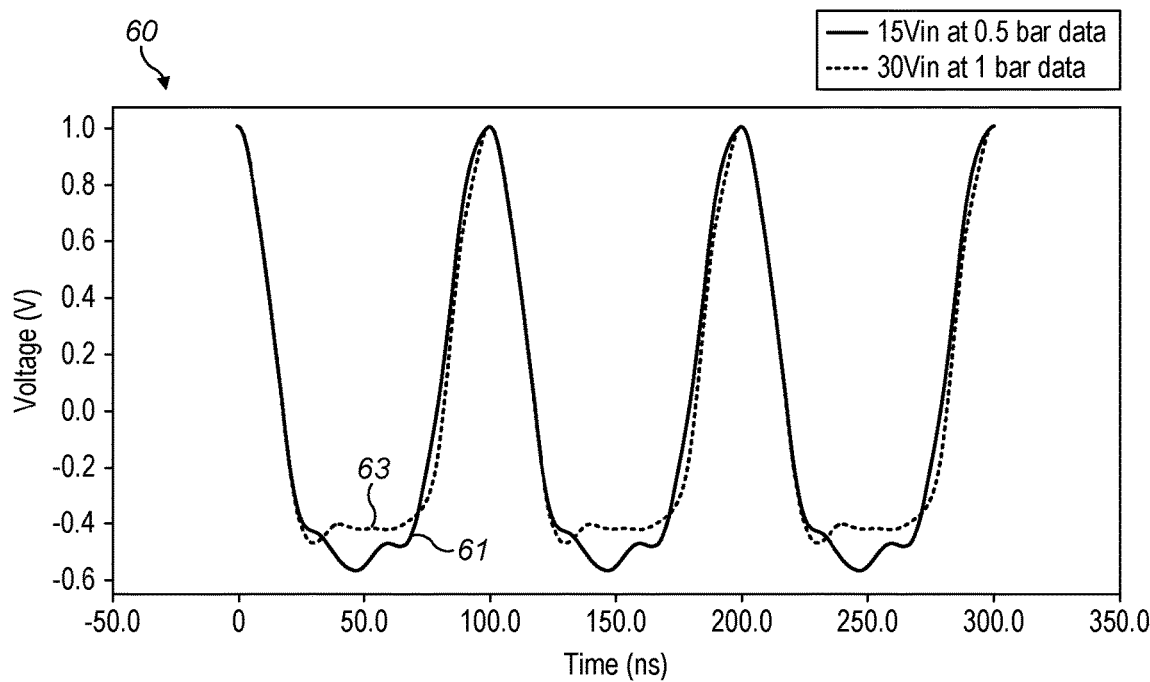
FIG. 6 is a plot of two waveforms generated at two different pressures and input voltages according to a existing waveform generator.

Referring to FIG. 6, there is shown an example plot 60 of the waveforms 61, 63 generated at two different pressure levels. The input voltages at these the two different pressure levels are different so as to maintain substantially the same Townsend value. The waveforms were generated without controlling the drive frequency of the switch in accordance with the present invention, and thus relate to an existing arrangement. In this plot, the voltage values are scaled for ease of comparison.

The waveform 61 was generated at a pressure of 0.5 bar (50000 Pascal) and an input voltage of 15 V. The waveform 63 was generated at a pressure of 1 bar (100 000 Pascal) and an input voltage of 30 V. Thus, at a lower pressure, a smaller electric field is required to be at the same Townsend value. Hence, the voltage generator is required to generate a smaller output voltage, and thus a smaller input voltage (voltage level of the DC voltage source) is used.

It can be seen in FIG. 6 that the two waveforms have different duty cycles. Further, the relative peak height of the two waveforms is different. Without being bound to any particular theory, the different waveform shapes are generally caused by stray capacitance effects which are caused, in particular, by the switch being voltage dependent.

Figure 7:
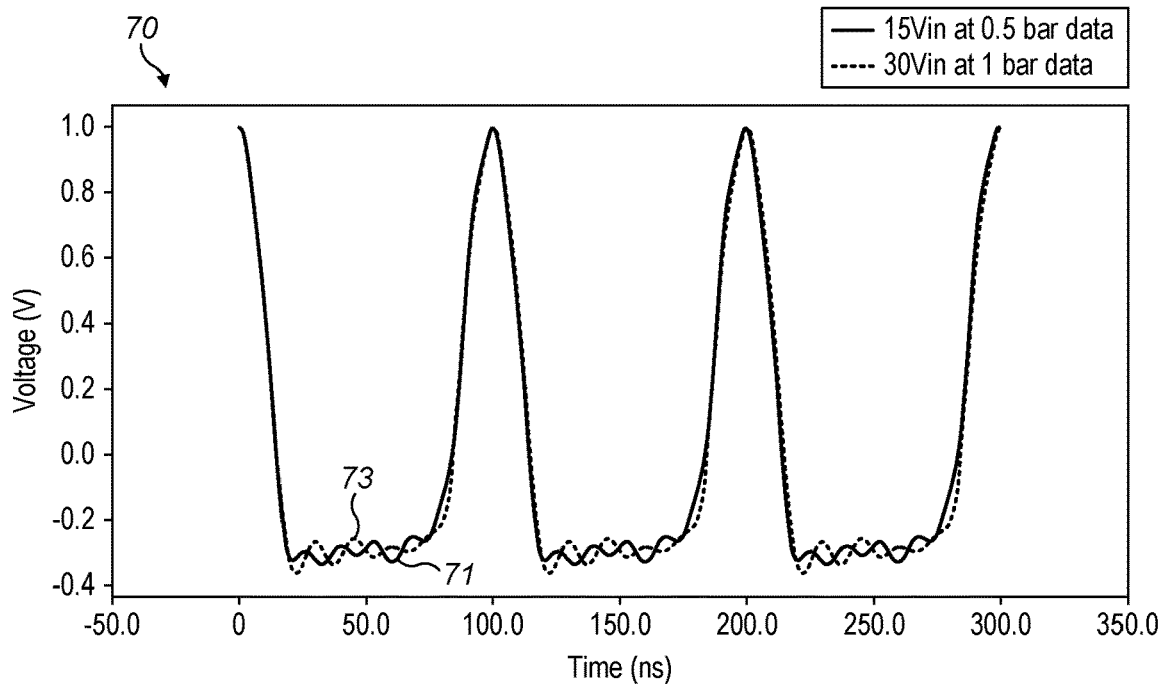
FIG. 7 is a plot of two waveforms generated at two different pressures and input voltages according to an example waveform generator of the present invention.

Referring to FIG. 7, there is shown an example plot 70 of waveforms 71, 73 generated at two different pressure levels. The input voltages at these two different pressure levels are different so as to maintain substantially the same Townsend value. In addition, the drive frequency of the switch was controlled in accordance with the present invention. In this plot, the voltages values are scaled for ease of comparison.

The waveform 71 was generated at a pressure of 0.5 bar (50000 Pascal) and an input voltage of 15 V. The waveform 73 was generated at a pressure of 1 bar (100 000 Pascal) and an input voltage of 30 V. It can be seen in FIG. 7 that the two waveforms have substantially the same duty cycles and substantially the same relative peak heights. This highlights the benefits provided by adjusting the frequency of the drive signal in accordance with the present invention. Without being bound to any particular theory, adjusting the frequency of the drive signal is believed to mitigate/offset the stray capacitance effects caused, in particular, by the switch being voltage dependent.

It will be appreciated that a change in temperature may separately, or additionally require the frequency of the drive signal to be adjusted. This is because the temperature also affects the electric field required to maintain a particular Townsend level. Most expected waveform generators will operate at a fixed gas temperature. This is usually because the gas temperature of the load driven by the waveform generator is operated independently of the outside temperature, and is usually always hotter than the outside temperature. However, if the gas temperature were varied, the frequency of the drive signal could also be adjusted to maintain a constant Townsend level.

In an example implementation, values for the drive frequency to use at particular input voltages may be determined in advance during a calibration process. This calibration process generally involves setting the voltage level of the DC voltage source to be at a first voltage level. The controller then adjusts the frequency of the drive signal until a desired peak output voltage for the waveform is reached. The duty cycle for the waveform at the desired peak output voltage is determined. The DC voltage source then steps through a number of different voltage levels, and the frequency of the drive signal at each of these voltage levels is adjusted until the duty cycle is the same as the determined duty cycle. This calibration process results in the determination of a plurality of voltage levels of the DC voltage source and a corresponding plurality of frequency values for the drive signal required to achieve the determined duty cycle at these voltage levels. These determined values can be stored in a look up table or used in a curve fitting procedure as described in more detail below.

Figure 8:
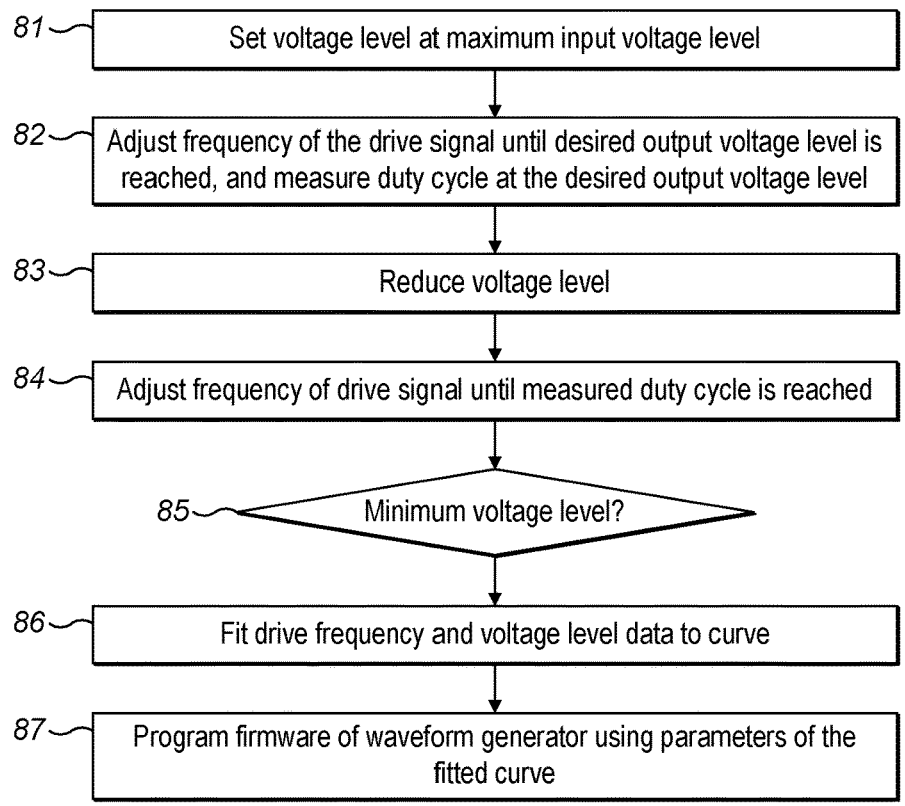
FIG. 8 is an example flow diagram of a method for calibrating a waveform generator according to the present invention.

FIG. 8 shows a flow diagram for an example calibration method in accordance with the present invention.

Step 81 comprises setting the voltage level of the DC voltage source to be at a maximum input voltage level (e.g. 60V). Here, "maximum input voltage level" refers to the maximum desired voltage level of the DC voltage source. This may not be the same as the actual or theoretical maximum input voltage level of the DC voltage source, but may rather be set by a user. The maximum input voltage level is not required to be 60 V, it may be less than (e.g. 40 V) or more than (e.g. 100 V) this value.

Step 82 comprises the controller adjusting the frequency of the drive signal supplied to the switch until a waveform with a desired output voltage level is reached (e.g. 500 V). Again, the desired output voltage level may be specified by the user. It is not required to be 500 V. It could be less than (e.g. 175 V) or more than (e.g. 1000 V) this value. The duty cycle of this generated waveform is measured. The frequency of the drive signal for this input voltage level is stored in a data store.

Step 83 comprises reducing the voltage level of the DC voltage source by an increment (e.g. to 50 V). Any increment may be used, e.g. 10V, 5V, 1V.

Step 84 comprises adjusting the frequency of the drive signal until the generated waveform has the same duty cycle as the waveform generated in step 82. The frequency of the drive signal for this input voltage level is stored in a data store.

Step 85 comprises determining whether the voltage level of the DC voltage source is at the minimum voltage level (e.g. 10 V). Here, "minimum input voltage level" refers to the minimum desired voltage level of the DC voltage source. This may not be the same as the actual or theoretical minimum input voltage level of the DC voltage source, but may rather be set by a user. The minimum input voltage level is not required to be 10 V, it may be less than (e.g. 1 V) or more than (e.g. 20 V) this value.

If the voltage level is not the minimum voltage level, steps 83 and 84 are repeated until the minimum voltage level is reached. The frequency of the drive signal required for each input voltage level is stored in the data store.

Step 86 comprises fitting the obtained frequency and input voltage level data to a curve. In particular, previous steps 82 to 85 will result in a plurality of ordered pairs (input voltage level, drive frequency) which are fit to a function that defines the relationship between the voltage level of the DC voltage source and the drive frequency to be supplied to the switch to achieve a particular duty cycle. The voltage level may be the dependent variable for the function, and the drive frequency may be the independent variable for the function. The function may be a polynomial function. The parameters (coefficients) of the function determined as a result of the fitting process may be stored, e.g. in the data store. Storing the parameters in the data store may mean that the parameters are programmed into firmware of the waveform generator/controller. Any curve/function fitting procedure as known in the art may be used. One particular example is least squares fitting.

Step 87 programs firmware of the waveform generator using the parameters of the fitted curve (e.g. the coefficients of a polynomial function which defines the curve). Using the parameters of the fitted curve, the controller of the waveform generator is able to determine for any required voltage level of the DC voltage source, the frequency of the drive signal required to adjust the duty cycle of the waveform to be at the required value.

It will be appreciated that steps 86 and 87 are not required in all examples. In particular, the waveform generator may simply store the drive frequency at each DC voltage level used in steps 81 to 86 in a look up table, which may subsequently be accessed by the controller to determine what drive frequency to be used at a particular voltage level of the DC voltage source. It will be appreciated that this approach will be sufficient if the waveform generator is only intended to operate at particular input voltage levels that correspond to the input voltage levels used in steps 81 to 86, or if a very large number of input voltage levels were used in steps 81 to 86.

Figure 9:
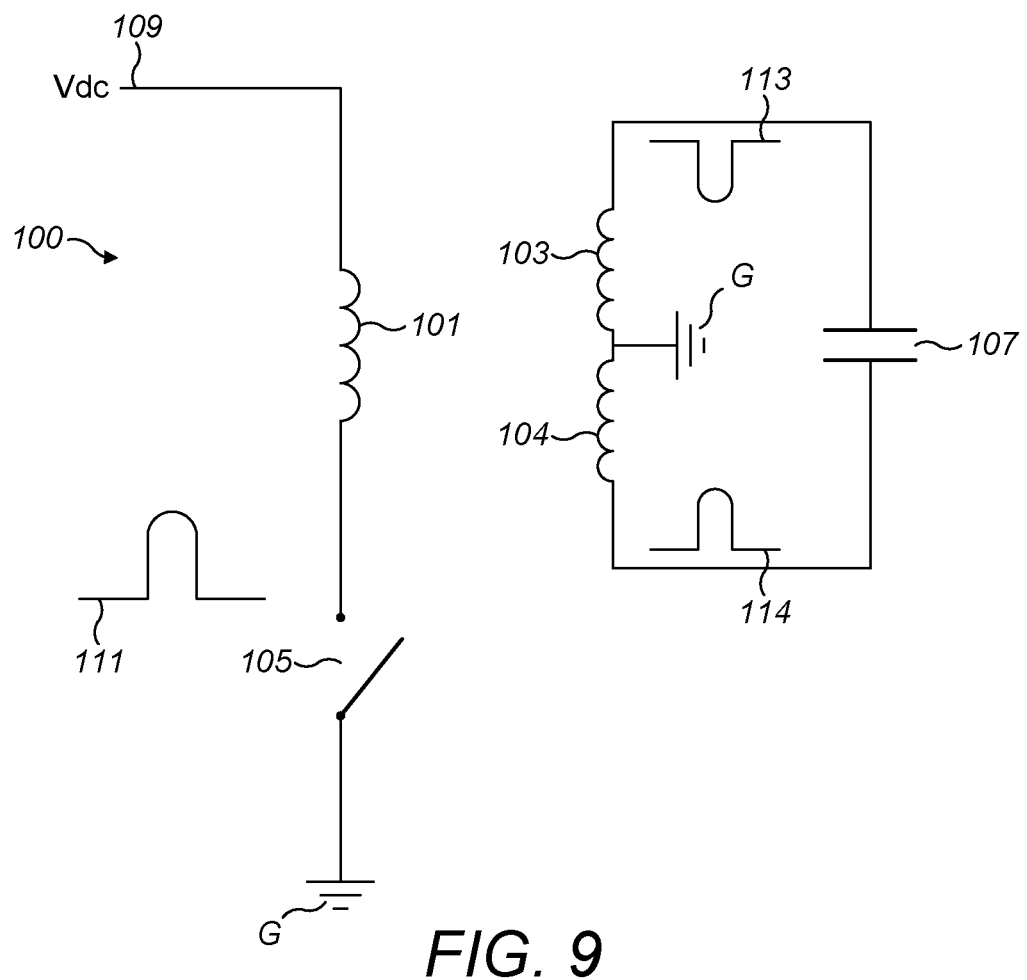
FIG. 9 is a schematic diagram of an example waveform generator suitable for the present invention.

FIG. 9 shows a circuit diagram for an example waveform generator 100 that is suitable for use with the present invention. The waveform generator 100 is an asymmetric waveform generator 100 and includes a Field Effect Transistor (FET) 105 connected to a primary winding 101 of a transformer. The transformer has two secondary windings 103, 104 conductively coupled together and to ground G. The two secondary windings 103, 104 are inductively coupled to the primary winding 101 of the transformer. The transformer is configured to deliver two waveforms 113, 114 of opposite polarity for providing a waveform voltage gain. In more detail, a DC voltage source 109 applies a DC voltage to the primary winding 101, and a drive signal switches the FET between ON and OFF states so as to generate a waveform 111 at the primary winding side. The inductive coupling between the primary winding 101 and the two secondary windings 103, 104 results in two waveforms 113, 114 of opposite polarity being generated at the secondary winding side. The two waveforms 113, 114 are supplied across a load 107. As a result of the opposite polarity of the two waveforms 113, 114, the two waveforms 113, 114 provide a voltage gain across the load 107.

A controller (not shown) is also provided in accordance with the present invention. The controller adjusts the frequency of the drive signal supplied to the switch according to the approaches described above.

Figure 10:
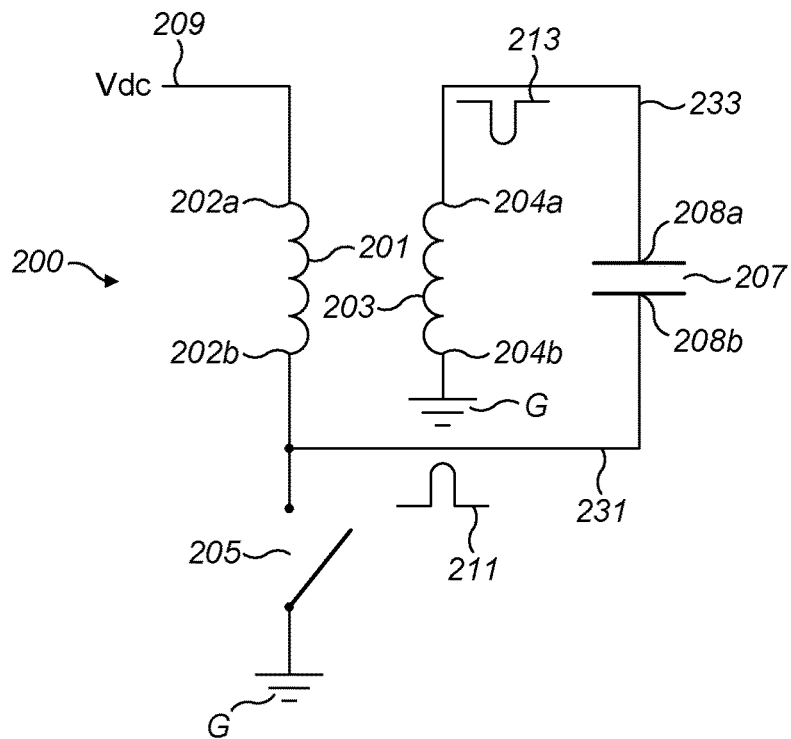
FIG. 10 is a schematic diagram of an example waveform generator suitable for the present invention.

FIG. 10 shows another waveform generator 200 that is suitable for use with the present invention. The waveform generator 200 is configured to generate two waveforms 211, 213 of opposite polarity so as to provide a voltage gain across the load 207. The waveform generator 200 comprises a primary side circuit comprising a first inductor 201. The waveform generator 200 comprises a secondary side circuit comprising a second inductor 203, a first output region 231 conductively coupled to the load 207 and a second output region 233 conductively coupled to the load 207. The second inductor 203 is arranged to be inductively coupled to the first inductor 201. That is, the second inductor 203 is positioned in proximity to the first inductor 201 such that there is an inductive coupling between the first and second inductors 201, 203.

The first inductor 201 is conductively coupled to the first output region 231 so as to supply a first 211 of the two waveforms 211, 213 to the load 207. The second inductor 203 is conductively coupled to the second output region 233 so as to supply a second 213 of the two waveforms 211, 213 to the load 207. The first and second output regions 231, 233 in this example are conductive wires that are conductively coupled to the load 207. In this example, the first inductor 201 and the second inductor 203 are both conductively coupled to the load 207 via the first and second output regions 231, 233.

In the example shown in FIG. 10, the first waveform 211 is shown as having a peak voltage with a positive polarity. The second waveform 213 is shown as having a peak voltage with a negative polarity. Across the load 207, the two waveforms 211, 213 additively combine to supply a peak voltage to the load 207 which is the sum of the magnitude of the peak voltages for the two waveforms 211, 213. For example, if the peak voltage of the first waveform 211 is +250V and the peak voltage of the second waveform 213 is −250V, the two waveforms 211, 213 additively combine to produce a peak voltage of +500V across the load 207.

The first terminal 202*a* of the first inductor 201 is conductively coupled to a DC voltage source 209. The second terminal 202*b* of the first inductor 201 is conductively coupled to the first output region 231 which is in turn conductively coupled to the load 207. In addition, the second terminal 202*b* of the first inductor 201 is conductively coupled to a switch 205. The second terminal 202*b* of the first inductor 201 is conductively coupled to one terminal of the switch 205, and another terminal of the switch 205 is conductively coupled to ground G.

The switch 205 is activated by a drive signal which means that the switch 205 transitions between ON and OFF states depending on the drive signal. The switch 205 being activated by the drive signal controls the generation of the two waveforms 201, 203. In particular, when the switch 205 is in the ON state, current flows through the first inductor 201. When the switch 205 transitions to the OFF state, a voltage rises across the first inductor 201. The first inductor 201 and the second inductor 203 are arranged such that when a voltage of a first polarity is applied across the first inductor 201, a voltage of the same polarity is induced in the second inductor 203. As a result, the voltage rising across the first inductor 201 causes a voltage having the same polarity to be induced in the second inductor 203.

The waveform generator 200 further comprise a controller (not shown) that is arranged to supply the drive signal to the switch 205 so as to control the generation of the two waveforms 211, 213. The controller is operable to adjust the frequency of the drive signal according to the approaches described above.

The first terminal 204a of the second inductor 203 is conductively coupled to the second output region 233 which is in turn conductively coupled to the load 207. The second terminal 204b of the second inductor 203 is conductively coupled to ground G.

The load 207 comprises a first terminal 208a and a second terminal 208b. The first terminal 208a comprises a first electrode 208a, and the second terminal 208b comprises a second electrode 208b. The first terminal 208a of the load 207 is conductively coupled to the second output region 233 which is in turn conductively coupled to the first terminal 204a of the second inductor 203. The second terminal 208b of the load 207 is conductively coupled to the first output region 231 which is in turn conductively coupled to the second terminal 202b of the first inductor 201.

Figure 11:
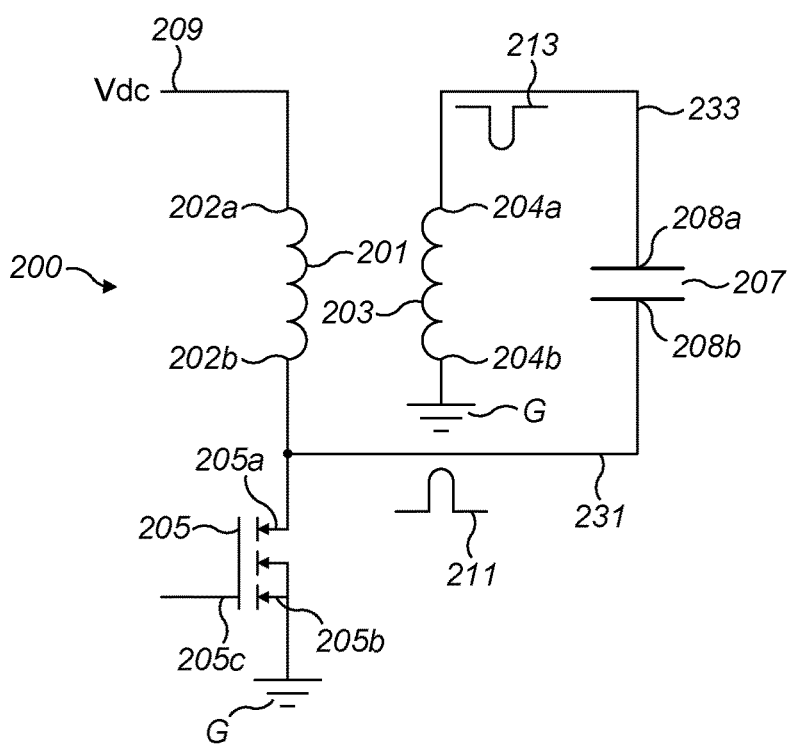
FIG. 11 is is a schematic diagram of an example waveform generator suitable for the present invention.

Referring to FIG. 11, there is shown another example of the waveform generator 200. In this example, the switch 205 is a Field Effect Transistor (FET) 205, and in particular is a Metal Oxide Semiconductor FET (MOSFET) 205. The second terminal 202b of the first inductor 201 is conductively coupled to the drain 205a of the MOSFET 205. The source 205b of the MOSFET 205 is conductively coupled to the ground G. The gate 205c of the MOSFET 205 is arranged to receive the drive signal. The other components of the waveform generator 200 of FIG. 11 are the same as the waveform generator 200 of FIG. 10. The same reference numerals have been used in FIG. 11.

Figure 12:
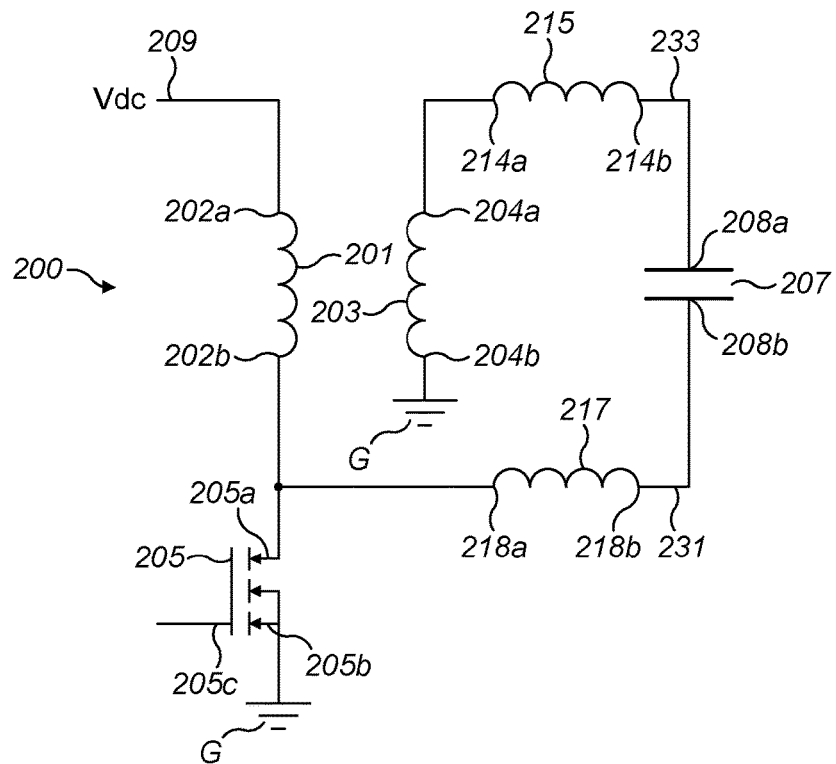
FIG. 12 is a schematic diagram of an example waveform generator suitable for the present invention.

Referring to FIG. 12, there is shown another example waveform generator 200. In this example, the second output region 233 comprises a third inductor 215. The second inductor 203 is conductively coupled to the third inductor 215 which is in turn conductively coupled to the load 207. The first terminal 204a of the second inductor 203 is conductively coupled to the first terminal 214a of the third inductor 215. The second terminal 214b of the third inductor 215 is conductively coupled to the first terminal 208a of the load 207. In this example, the first output region 231 comprises a fourth inductor 217. The first inductor 201 is conductively coupled to the fourth inductor 217 which is in turn conductively coupled to the load 207. The second terminal 202b of the first inductor 201 is conductively coupled to the first terminal 218a of the fourth inductor 217. The second terminal 218b of the fourth inductor 217 is conductively coupled to the second terminal 208b of the load 207. The other components of the waveform generator 200 of FIG. 12 are the same as the waveform generator 200 of FIGS. 10 and 11. The same reference numerals have been used in FIG. 12.

While not being bound to any particular theory, the added third inductor 215 and/or fourth inductor 217 resonate with the capacitance of the load 207. The addition of the third inductor 215 and/or fourth inductor 217 result in narrower waveform peaks 211, 213 with a higher peak voltage. This results in a higher voltage being generated across the load 207 for the same input DC voltage 209 and MOSFET 205. The waveform generator 200 of FIG. 12 may have a reduced operational frequency range as compared to the waveform generator 200 of FIGS. 10 and 11. In addition, slightly more ringing artefacts on the waveforms may be expected than in the waveform generator 200 of FIGS. 10 and 11.

Figure 13:
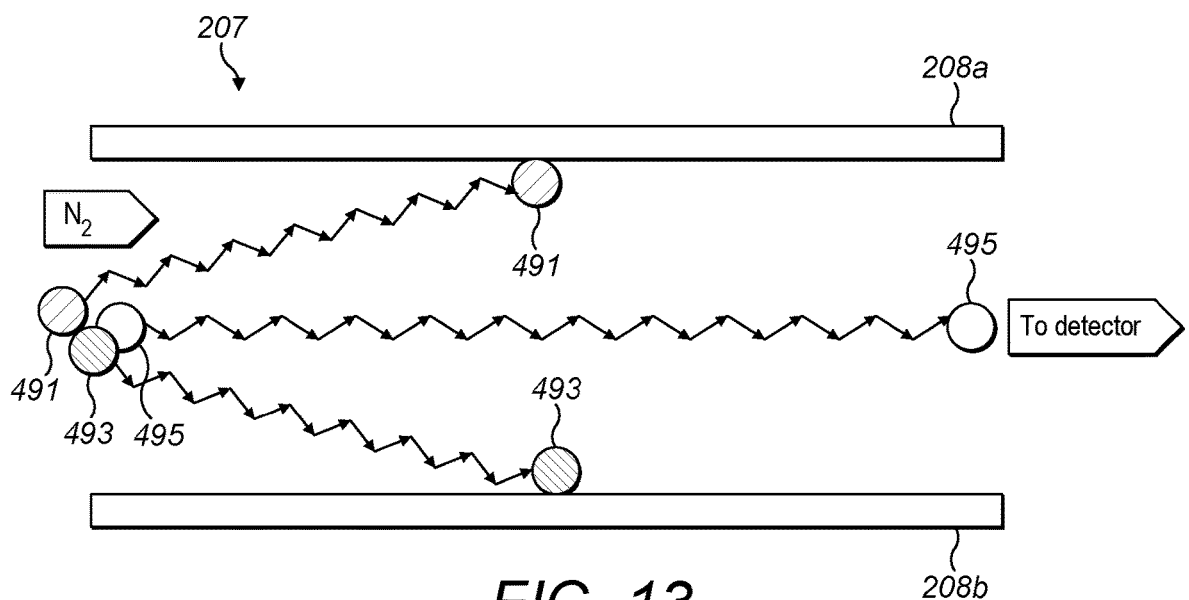

Referring to FIG. 13, there is shown an example load 207. The load 207 is an ion filter device 207, and in particular is a Field Asymmetric Ion Mobility Spectrometer (FAIMS) 207. FAIMS 207 may be used to distinguish charged gaseous molecules according to differences in the speed that the molecules move through a buffer gas under the influence of an oscillating electric field.

The FAIMS 207 comprises two electrodes 208a, 208b in the form of parallel plates 208a, 208b which are spaced apart so as to define a channel 219. The first parallel plate 208a is conductively coupled to the second output region 233 (FIGS. 10, 11 and 12). The second parallel plate 208b is conductively coupled to the first output region 231 (FIGS. 10, 11 and 12). The waveform generator 200 (FIGS. 10, 11, and 12) applies the two waveforms 211, 213 (FIGS. 10, 11 and 12) across the parallel plates 208a, 208b which results in an alternating electric field being applied across the channel 219. In this example, the applied waveforms 211, 213 are asymmetric waveforms, meaning that the duty cycle is less than 50%.

In an example application, vapour from a sample to be analysed is first ionized, and then passed through the channel 219 between the two parallel plates 208a, 208b. During the periods when the waveform applied across the parallel plates 208a, 208b has a positive polarity, the ions will drift in one direction at a velocity based on the ions individual mobility in that electric field. As the applied waveform reverses in polarity, the ions change direction and speed based on the new electric field conditions. As the mobility of the ions during the two parts of the waveform is rarely equal, there is usually a net drift towards one of the parallel plates 208a, 208b. In the FAIMS 207, this net drift is corrected for by applying an additional DC voltage, known as the compensation voltage, focussing specific ions through the FAIMS 207 to the detector.

In the example shown in FIG. 13, it can be seen that three ions 491, 493, 495 are introduced into the channel 219 between the two parallel plates 208a, 208b. The ions 491, 493, 495 follow a generally saw-tooth trajectory due to the application of the alternating waveform to the two parallel plates 208a, 208b. Due to the different mobility behaviours of the three ions 491, 493, and 495 under the influence of the electric field, and in particular due to how the mobility of the ions 491, 493, and 495 vary with the electric field strength, each of three ions 491, 493, 495 follow a different trajectory in the channel 219. The trajectory of two of the ions 491, 493 collide with the parallel plates 208a, 208b. The ion 495 has the appropriate compensation voltage applied, meaning that its trajectory traverses the channel 219 of the FAIMS 207. By scanning through a range of magnitudes of waveforms applied to the parallel plates 208a, 208b, and a range of compensation voltages, and by recording the ion current at each magnitude/compensation voltage value, the FAIMS 207 can be used to generate information about the different compounds present in a sample.

Figure 14:
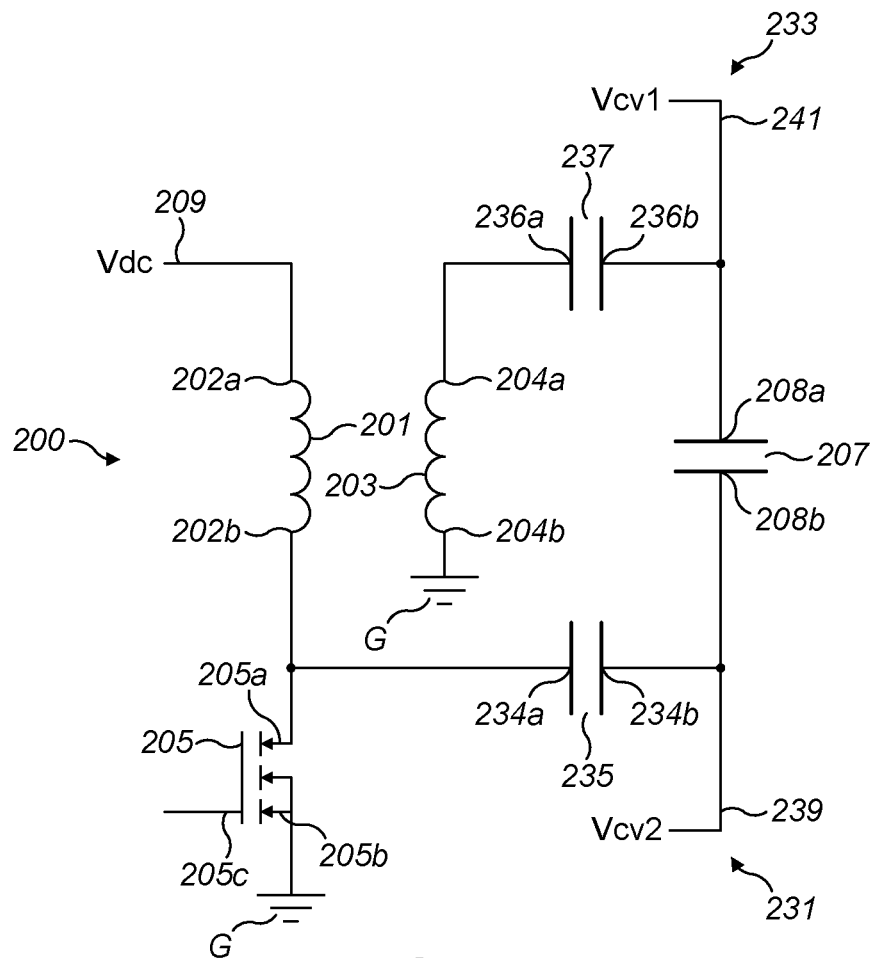
FIG. 14 is a schematic diagram of another example waveform generator suitable for the present invention.

Referring to FIG. 14, there is shown another example waveform generator 200. In this example, a compensation voltage is applied to the FAIMS 207. The first terminal 208a of the FAIMS 207 is conductively coupled to a first DC compensation voltage source 241. The second terminal 208b of the FAIMS 207 is conductively coupled to a second DC compensation voltage source 239. In this way, a DC compensation voltage is applied across the FAIMS 207. The first output region 231 comprises a first capacitor 235. The first capacitor 235 has a first terminal 234a conductively coupled to the second terminal 202b of the first inductor 201, and a second terminal 234b conductively coupled to the second terminal 208b of the FAIMS 207. The second output region 233 comprises a second capacitor 237. The second capacitor 237 has a first terminal 236a conductively coupled to the first terminal 204a of the second inductor 203, and a second terminal 236b conductively coupled to the first terminal 208a of the FAIMS 207. The other components of the waveform generator 200 of FIG. 14 are the same as the waveform generator 200 of FIGS. 10, 11, and 12. The same reference numerals have been used in FIG. 14.

The first capacitor 235 and the second capacitor 237 may be selected such that they do not have a significant effect on the waveform voltage generation. For example, the first and second capacitors 235, 237 may have a high capacitance of 10 nF or more so as to cause only a small voltage drop. The first and second capacitors 235, 237 are provided to block DC current flowing to ground G via the MOSFET 205 or the second inductor 203 as a result of the applied DC compensation voltages. As the first and second capacitors 235, 237 are arranged in series with the FAIMS 207, and have high capacitance values, they have a minimal effect on the performance of the waveform generator 200.

The first and second capacitors 235, 237 may be combined with the third and fourth inductors 215, 217. That is, the first output region 231 may comprise the fourth inductor 217 and the first capacitor 235 connected in series. Either the first capacitor 235 or the fourth inductor 217 may be conductively coupled to the second terminal 208b of the load 207. In addition, the second output region 233 may comprise the third inductor 215 and the second capacitor 237 connected in series. Either the second capacitor 237 or the third inductor 215 may be conductively coupled to the first terminal 208a of the load 207.

The present invention is not limited to waveform generators 200 for FAIMS 207. Instead, it will be appreciated that the waveform generator 200 of the first aspect is ideally suited for the generation of waveforms for FAIMS 207. This is at least because the waveform generator 200 is able to generate stable, high peak voltage waveforms, with a high frequency, and with sharp transitions between the troughs and the peaks of the waveform. In addition, as the waveform generator 200 of the first aspect can be operated at lower power due to reduced parasitic effects, it is ideally suited for battery operated, and portable, FAIMS 207.

The present invention is not limited to the particular waveform generators described above, these are just advantageous examples. Instead, any appropriate waveform generator may be used, provided a controller arranged to supply a drive signal to the switch for switching the switch between on and off states is included. The controller is arranged to adjust the frequency of the drive signal so as to control at least one of the peak voltage and the duty cycle of a waveform generated by the waveform generator.

Figure 15:
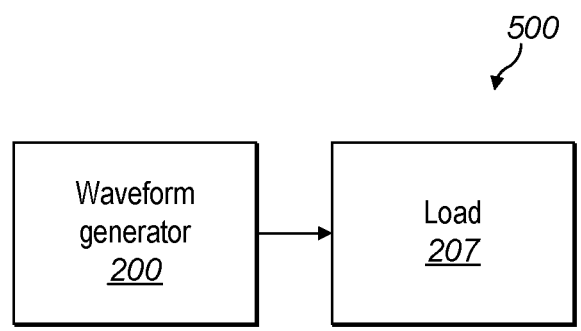
FIG. 15 is a schematic diagram of an example system according to the present invention.

Referring to FIG. 15, there is shown an example system according to the second aspect and indicated generally by the reference numeral 500. The system 500 comprises the waveform generator 200 and the load 207, which may be a FAIMS 207.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements. Various combinations of optional features have been described herein, and it will be appreciated that described features may be combined in any suitable combination. In particular, the features of any one example embodiment may be combined with features of any other embodiment, as appropriate, except where such combinations are mutually exclusive. Throughout this specification, the term "comprising" or "comprises" means including the component(s) specified but not to the exclusion of the presence of others.

Although a few preferred embodiments of the present invention have been shown and described, it will be appreciated by those skilled in the art that various changes and modifications might be made without departing from the scope of the invention, as defined in the appended claims.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A waveform generator comprising:
a switch;
a transformer having a primary side circuit and a secondary side circuit, the primary side circuit having a first terminal arranged to be conductively coupled to a DC voltage source, and a second terminal conductively coupled to the switch; and
a controller arranged to:
supply a drive signal to the switch for switching the switch between on and off states,
adjust a frequency of the drive signal to control at least one of a peak voltage and a duty cycle of a waveform generated by the waveform generator,
adjust the frequency of the drive signal as the voltage level of the DC voltage source changes to substantially maintain the duty cycle of the waveform generated by the waveform generator at a constant value by mitigating a voltage dependent capacitance effect of the switch,
receive the voltage level of the DC voltage source, and
determine a frequency of the drive signal to be supplied to the switch based on the voltage level of the DC voltage source to substantially maintain the duty cycle of the waveform generated by the waveform generator at a constant value,
wherein the received voltage level of the DC voltage source is determined based on a desired field strength of an oscillating electric field generated by the waveform.

2. The waveform generator as claimed in claim 1, wherein the controller is arranged to adjust the frequency of the drive signal while a voltage level of the DC voltage source remains substantially constant.

3. The waveform generator as claimed in claim 1, wherein the received voltage level of the DC voltage source is determined based on the desired field strength and an indication of an atmospheric pressure level in a vicinity of the waveform generator.

4. The waveform generator as claimed in claim 1, wherein the received voltage level of the DC voltage source is determined based on the desired field strength and an indication of a temperature in a vicinity of the waveform generator.

5. The waveform generator as claimed in claim 1, wherein the received voltage level of the DC voltage source is determined by determining a desired voltage of the waveform so as to achieve the desired field strength, and by determining a voltage level of the DC voltage source that results in the waveform having the desired voltage.

6. The waveform generator as claimed in claim 5, wherein:
the desired voltage of the waveform is determined by multiplying the desired field strength by a multiplication factor, and
optionally the multiplication factor includes an indication of an atmospheric pressure level in a vicinity of the waveform generator, and
optionally the multiplication factor includes an indication of a temperature in the vicinity of the waveform generator.

7. The waveform generator as claimed in claim 1, wherein:
the controller is arranged to access a data store comprising a plurality of predetermined frequency values for the drive signal, and
the controller is arranged to adjust the frequency of the drive signal according to one of the plurality of predetermined frequency values.

8. The waveform generator as claimed in claim 7, wherein:
the data store comprises the plurality of predetermined frequency values and a plurality of voltage levels, each of the voltage levels corresponding to one of the predetermined frequency values, and
the controller is arranged to receive the voltage level of the DC voltage source and select a predetermined frequency value that corresponds to the voltage level of the DC voltage source.

9. The waveform generator as claimed in claim 8, wherein:
the controller is arranged to adjust the frequency of the drive signal as the voltage level of the DC voltage source changes so as to substantially maintain the duty cycle of the waveform generated by the waveform generator at a constant value, and
each of the plurality of predetermined frequency values is selected so that, when the DC voltage source is at an associated voltage level, the drive signal with the predetermined frequency value is supplied to the switch, and as such the duty cycle of the waveform generated by the waveform generator is substantially equal to the constant value.

10. The waveform generator as claimed in claim 1, wherein:
the controller is arranged to access a data store comprising parameters for a function that defines a relationship between a voltage level of the DC voltage source and a drive frequency to be supplied to the switch to achieve a particular duty cycle,
the controller is operable to use a voltage level of the DC voltage source and obtained parameters for the function so as to determine the drive frequency required to be supplied to the switch so as to achieve the particular duty cycle.

11. The waveform generator as claimed in claim 1, wherein the controller is arranged to adjust the frequency of the drive signal as the DC voltage source is at a first voltage level so as to generate a waveform having a predetermined peak voltage.

12. The waveform generator as claimed in claim 11, wherein:
the controller is arranged to determine the duty cycle of the waveform having the predetermined peak voltage, and
the controller is arranged to adjust the frequency of the drive signal as the DC voltage source is at a second voltage level so as to generate a waveform having the determined duty cycle.

13. The waveform generator as claimed in claim 12, wherein for each of a plurality of other voltage levels of the DC voltage source, the controller is arranged to adjust the frequency of the drive signal so as to adjust the generated waveform to have the same duty cycle as a predetermined duty cycle.

14. The waveform generator as claimed in claim 1, wherein:
the switch is a voltage dependent switch, and optionally a Field Effect Transistor (FET), the transformer is conductively coupled to a drain of the FET, and a gate of the FET is arranged to receive the drive signal.

15. The waveform generator as claimed in claim 1, wherein:

the waveform generator is configured to generate two waveforms of opposite polarity so as to provide a voltage gain across a load, the primary side circuit comprises a first inductor, the secondary side circuit comprises a second inductor inductively coupled to the first inductor, a first output region conductively coupled to the load, and a second output region conductively coupled to the load, the first inductor is arranged to be conductively coupled to the first output region so as to supply a first of the two waveforms to the load, and the second inductor is arranged to be conductively coupled to the second output region so as to supply a second of the two waveforms to the load.

* * * * *